US009467145B2

(12) United States Patent
Song et al.

(10) Patent No.: US 9,467,145 B2
(45) Date of Patent: Oct. 11, 2016

(54) DATA OUTPUT CIRCUIT

(75) Inventors: Won Sub Song, Gyeonggi-do (KR); Jong Tai Park, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 13/225,749

(22) Filed: Sep. 6, 2011

(65) Prior Publication Data

US 2012/0056642 A1    Mar. 8, 2012

(30) Foreign Application Priority Data

Sep. 7, 2010    (KR) .................. 10-2010-0087472

(51) Int. Cl.
*H03K 19/003* (2006.01)
*H03K 19/0175* (2006.01)

(52) U.S. Cl.
CPC .............. *H03K 19/017545* (2013.01); *H03K 19/017581* (2013.01)

(58) Field of Classification Search
CPC .............. H03K 19/0005; H03K 19/018528; H03K 19/018585; H03K 17/164; H03K 19/00384; H03K 19/018521; H03K 19/017509; H03K 17/162; H03K 19/00315; H03K 19/00361; G11C 7/1057; G11C 7/1051; G11C 2207/2254
USPC ........................ 326/26, 30, 81–83, 86–87; 327/108–109
See application file for complete search history.

(56) References Cited

U.S. PATENT DOCUMENTS

| 5,834,860 | A  | * | 11/1998 | Parsons ................ G11C 7/1051 307/104 |
| 6,356,105 | B1 | * | 3/2002  | Volk .................. H03K 19/00361 326/21 |
| 6,424,170 | B1 | * | 7/2002  | Raman ................ G06F 13/4072 326/30 |
| 7,038,486 | B2 | * | 5/2006  | Aoyama ............. H04L 25/0278 326/108 |
| 7,205,786 | B2 | * | 4/2007  | Ahmad ................ H03K 17/164 326/26 |
| 7,221,193 | B1 | * | 5/2007  | Wang et al. ................. 327/108 |
| 7,362,128 | B2 | * | 4/2008  | Choi .................. H03K 19/0005 326/30 |

(Continued)

FOREIGN PATENT DOCUMENTS

KR         100940854        2/2010
KR      1020100073331       7/2010

OTHER PUBLICATIONS

Office Action issued by the Korean Intellectual Property Office on Dec. 26, 2011.

(Continued)

*Primary Examiner* — Crystal L Hammond
(74) *Attorney, Agent, or Firm* — IP & T Group LLP

(57) ABSTRACT

A data output circuit includes a main driver including a pull-up driver, coupled between a power supply terminal and a node coupled to the pad and a pull-down driver coupled between the node and a ground terminal, an impedance controller configured to control an output impedance at the node by sensing a voltage at the node and to generate pull-up control signals and pull-down control signals based on the sensed voltage, and a pre-driver configured to control driving strengths of the pull-up driver and the pull-down driver in response to the pull-up control signals, the pull-down control signals, and data.

14 Claims, 6 Drawing Sheets

(56) References Cited

U.S. PATENT DOCUMENTS

| | | | |
|---|---|---|---|
| 7,385,414 B2* | 6/2008 | Kim | H03K 19/0005 326/30 |
| 7,514,954 B2* | 4/2009 | Kim | G11C 7/1051 326/30 |
| 7,679,397 B1* | 3/2010 | Kok | H03K 19/0005 326/30 |
| 7,688,105 B2* | 3/2010 | Wong | H04L 25/0278 326/21 |
| 7,782,078 B2* | 8/2010 | Koo | G11C 5/063 326/30 |
| 7,834,654 B2* | 11/2010 | Millar | G11C 5/063 326/30 |
| 7,859,296 B2* | 12/2010 | Kim | G11C 5/147 326/30 |
| 7,961,000 B1* | 6/2011 | Gross | H04L 25/0278 326/30 |
| 7,973,553 B1* | 7/2011 | Wang | H04L 25/0278 326/30 |
| 8,022,723 B1* | 9/2011 | Wang | H04L 25/0298 326/30 |
| 8,085,062 B2* | 12/2011 | Gaskins | G06F 13/4086 326/30 |
| 8,242,802 B2* | 8/2012 | Gaskins | G06F 13/4072 326/30 |
| 8,508,251 B2* | 8/2013 | Choi | H03K 19/0005 326/30 |
| 2003/0141894 A1* | 7/2003 | Gonzalez | H03K 17/166 326/26 |
| 2007/0057692 A1* | 3/2007 | Chuang | H03K 19/0005 326/30 |
| 2008/0303546 A1* | 12/2008 | Millar | G11C 5/063 326/30 |
| 2009/0002018 A1* | 1/2009 | Jeong | H04L 25/028 326/30 |
| 2009/0146694 A1* | 6/2009 | Kim | H03K 5/153 327/77 |
| 2009/0295426 A1* | 12/2009 | Ayyapureddi | H03K 19/00384 326/30 |
| 2010/0007373 A1* | 1/2010 | Wong | H04L 25/0278 326/30 |
| 2010/0060316 A1* | 3/2010 | Kim | G11C 5/147 326/30 |
| 2010/0164540 A1* | 7/2010 | Kwean | G11C 5/063 326/30 |
| 2010/0207680 A1* | 8/2010 | Kuwahara | H03K 19/01758 327/520 |
| 2011/0109344 A1* | 5/2011 | Choi | H03K 19/0005 326/30 |

OTHER PUBLICATIONS

Notice of Allowance issued from the Korean Intellectual Property Office on Jun. 28, 2012.

\* cited by examiner

| PU-CTRL<2> | PU-CTRL<1> | PU-CTRL<0> | PU-CTRL<3> | PU-CTRL<4> | PU-CTRL<5> | SR code | | | PMOS drivability |
|---|---|---|---|---|---|---|---|---|---|
| up3pu | up2pu | up1pu | up1pu | up2pu | up3pu | PSR0 | PSR1 | PSR2 | |
| 0 | 0 | 0 | 0 | 0 | 0 | 0 | 0 | 0 | very weak |
| 1 | 0 | 0 | 0 | 0 | 0 | 0 | 0 | 0 | very weak |
| 1 | 1 | 0 | 0 | 0 | 0 | 1 | 0 | 0 | weak |
| 1 | 1 | 1 | 0 | 0 | 0 | 1 | 1 | 0 | default |
| 1 | 1 | 1 | 1 | 0 | 0 | 0 | 1 | 1 | strong |
| 1 | 1 | 1 | 1 | 1 | 0 | 1 | 1 | 1 | very strong |
| 1 | 1 | 1 | 1 | 1 | 1 | 1 | 1 | 1 | very strong |

| PD-CTRL <2> | PD-CTRL <1> | PD-CTRL <0> | PD-CTRL <3> | PD-CTRL <4> | PD-CTRL <5> | SR code | | | NMOS drivability |
|---|---|---|---|---|---|---|---|---|---|
| up3pd | up2pd | up1pd | dn1pd | dn2pd | dn3pd | NSR0 | NSR1 | NSR2 | |
| 1 | 1 | 1 | 1 | 1 | 1 | 1 | 1 | 1 | very weak |
| 0 | 1 | 1 | 1 | 1 | 1 | 1 | 1 | 1 | very weak |
| 0 | 0 | 1 | 1 | 1 | 1 | 0 | 1 | 1 | weak |
| 0 | 0 | 0 | 1 | 1 | 1 | 0 | 0 | 1 | default |
| 0 | 0 | 0 | 0 | 1 | 1 | 0 | 1 | 0 | strong |
| 0 | 0 | 0 | 0 | 0 | 1 | 0 | 0 | 0 | very strong |
| 0 | 0 | 0 | 0 | 0 | 0 | 0 | 0 | 0 | very strong |

DATA OUTPUT CIRCUIT

CROSS-REFERENCE TO RELATED APPLICATION

Priority to Korean patent application number 10-2010-0087472 filed on Sep. 7, 2010, the entire disclosure of which is incorporated by reference herein, is claimed.

BACKGROUND

Exemplary embodiments relate to a data output circuit and, more particularly, to a data output apparatus for controlling an output impedance.

A semiconductor device includes I/O pins for sending or receiving external data and a data output circuit for externally providing internal data. The I/O pins of a semiconductor device may be coupled to transmission lines, such as printed wirings on a substrate mounted on the semiconductor device. The internal data of a semiconductor device is provided to another semiconductor device through transmission lines (that is, through an interface). In order for the output data of a semiconductor device to be optimally transmitted through transmission lines, the output impedance of I/O pins is to be matched with the impedance of the transmission lines.

A data output circuit may include a pre-driver and a main driver. A main driver may control the output impedance of the I/O pins so that the output impedance is matched with the impedance of the transmission lines in order to support a high speed operation of the semiconductor memory device.

Meanwhile, a known data output circuit may supply the output signal of the pre-driver to the main driver regardless of a change in an output impedance of the main driver. Accordingly, a slew rate of an output signal varies according to the impedance of the main driver.

BRIEF SUMMARY

Exemplary embodiments relate to a data output apparatus for controlling the slew rate of an output signal by controlling impedance and controlling driving power of a pre-driver.

A data output circuit according to an aspect of the present disclosure includes a main driver including a pull-up driver coupled between a power supply terminal and a node coupled to the pad and output impedance at the node by sensing a voltage at the node and to generate pull-up control signals and pull-down control signals based on the sensed voltage, and a pre-driver configured to control driving strengths of the pull-up driver and the pull-down driver in response to the pull-up control signals, the pull-down control signals, and data.

A data output circuit according to another aspect of the present disclosure includes a pull-up driving circuit coupled between a pad and a power supply terminal and configured to control a pull-up driving strength of the pull-up driving circuit in response to pull-up driving control signals, a pull-down driving circuit coupled between the pad and a ground terminal and configured to control a pull-down driving strength of the pull-down driving circuit in response to pull-down driving control signals, a first signal generating circuit configured to generate pull-up enable signals and first driving control signals in response to a data signal and pull-up control signals, a second signal generating circuit configured to generate pull-down enable signals and second driving control signals in response to the data signal and pull-down control signals, a pull-up pre-driver group configured to output the pull-up driving control signals in response to the pull-up enable signals and the second driving control signals, and a pull-down pre-driver group configured to output the pull-down driving control signals in response to the pull-down enable signals and the first driving control signals.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

According to an exemplary embodiment, a data output circuit includes a main driver, an impedance controller, and a pre-driver. The impedance controller includes a pull-up impedance controller and a pull-down impedance controller. The pre-driver includes a pull-up pre-driver and a pull-down pre-driver.

The pull-down impedance controller of the data output circuit is described below.

Figure 1:
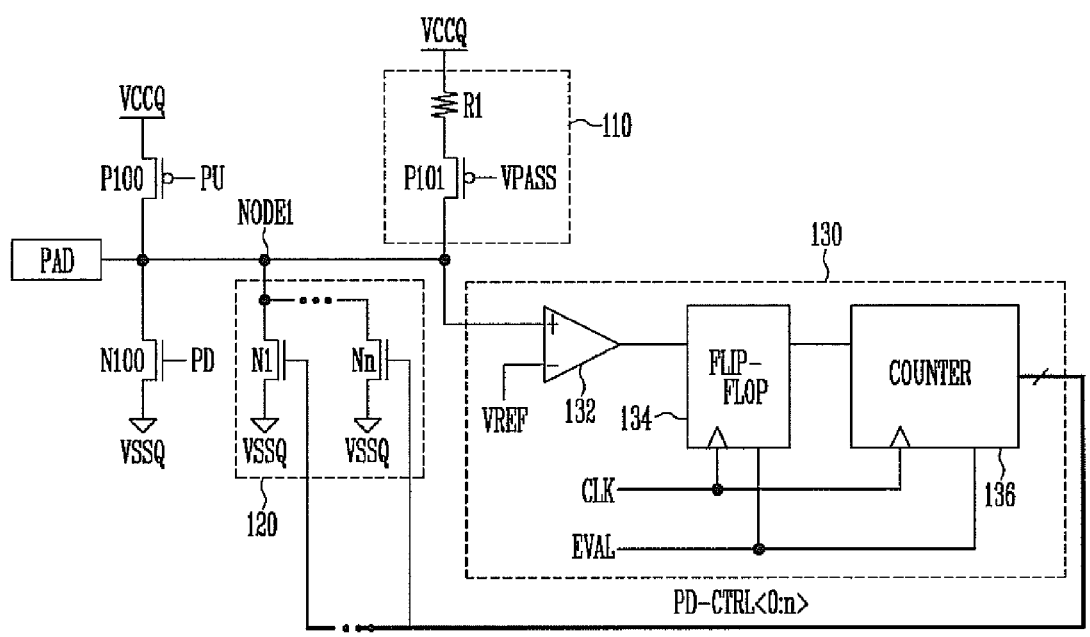
FIG. 1 is a circuit diagram of the pull-down impedance controller of a data output circuit according to an exemplary embodiment of this disclosure.

FIG. 1 is a circuit diagram of the pull-down impedance controller of a data output circuit according to an exemplary embodiment of this disclosure.

Referring to FIG. 1, a main driver includes a pull-up driver P100 and a pull-down driver N100. The pull-up driver P100 is coupled between a power supply terminal VCCQ and a node NODE1 coupled to a pad PAD. The pull-down driver N100 is coupled between a ground terminal VSSQ and the node NODE1. The main driver is operated in response to pull-up data PU and pull-down PD. More particularly, the pull-up driver P100 is operated in response to the pull-up data PU, and the pull-down driver N100 is operated in response to the pull-down data PD. According to an example, only one of the pull-up driver P100 and the pull-down driver N100 is turned on at a time.

The pull-down impedance controller senses a voltage of the node NODE1 and controls impedance of the node NODE1 for the pull-down driver N100 (hereinafter referred to as 'pull-down impedance') based on the sensed voltage. The pull-down impedance controller includes a first resistor unit 110, a first variable resistor circuit 120, and a first impedance controller 130.

More particularly, the first resistor unit 110 is coupled between the node NODE1 and the power supply terminal VCCQ and configured to have a constant resistance value. More particularly, the first resistor unit 110 includes a resistor R1 and a switching element P101 coupled in series between the power supply terminal VCCQ and the node NODE1. The switching element P101 is operated in response to a pass signal VPASS. According to an example, the pass signal VPASS has a voltage level equal to a sum of the power supply voltage VCCQ and 2Vt, where Vt is the threshold voltage of the switching element P101.

The first variable resistor circuit 120 varies a resistance value between the node NODE1 and the ground terminal VSSQ in order to control the pull-down impedance in response to pull-down control signals PD-CTRL<0:n> generated by the first impedance controller 130.

More particularly, the first variable resistor circuit 120 includes a plurality of switching elements N1 to Nn coupled in parallel between the node NODE1 and the ground terminal VSSQ. The switching elements N1 to Nn are selectively turned on in response to the respective pull-down control signals PD-CTRL<0:n>. The resistance value of the first variable resistor circuit 120 between the node NODE1 and the ground terminal VSSQ is changed according to the number of turned-on switching elements N1 to Nn. For example, with an increase in the number of turned-on switching elements, the resistance value between the node NODE1 and the ground terminal VSSQ is lowered.

The first impedance controller 130 senses voltage of the node NODE1, outputs the pull-down control signals PD-CTRL<0:n> according to the sensed voltage, and changes data of the pull-down control signals PD-CTRL<0:n> according to the sensed voltage.

More particularly, the first impedance controller 130 includes a first comparator 132, a first flip-flop 134, and a first counter 136. The first comparator 132 compares a reference voltage VREF and a voltage of the node NODE1 and outputs a result of the comparison. The first flip-flop 134 transfers the output signal (that is, a result of the comparison) of the first comparator 132 in response to an enable signal EVAL and a clock signal CLK. The first counter 136 changes data of the pull-down control signals PD-CTRL<0:n> based on the output signal of the first flip-flop 134 in response to the enable signal EVAL and the clock signal CLK.

According to an example, a resistance value between the power supply terminal VCCQ and the node NODE1 which is determined by the first resistor unit 110 is to be the same as a resistance value between the ground terminal VSSQ and the node NODE1 which is determined by the first variable resistor circuit 120. To this end, the first impedance controller 130 compares voltage of the node NODE1 and the reference voltage VREF, where the reference voltage VREF is equal to a half of the power supply voltage VCCQ. If, as a result of the comparison, the voltage of the node NODE1 is higher than VCCQ/2, the first impedance controller 130 generates the pull-down control signals PD-CTRL<0:n> so that the number of switching elements N1 to Nn turned on in the first variable resistor circuit 120 is increased. If, as a result of the comparison, the voltage of the node NODE1 is lower than VCCQ/2, the first impedance controller 130 generates the pull-down control signals PD-CTRL<0:n> so that the number of switching elements N1 to Nn turned off in the first variable resistor circuit 120 is decreased.

Accordingly, the pull-down impedance controller in FIG. 1 controls impedance for the pull-down driver.

Figure 2:
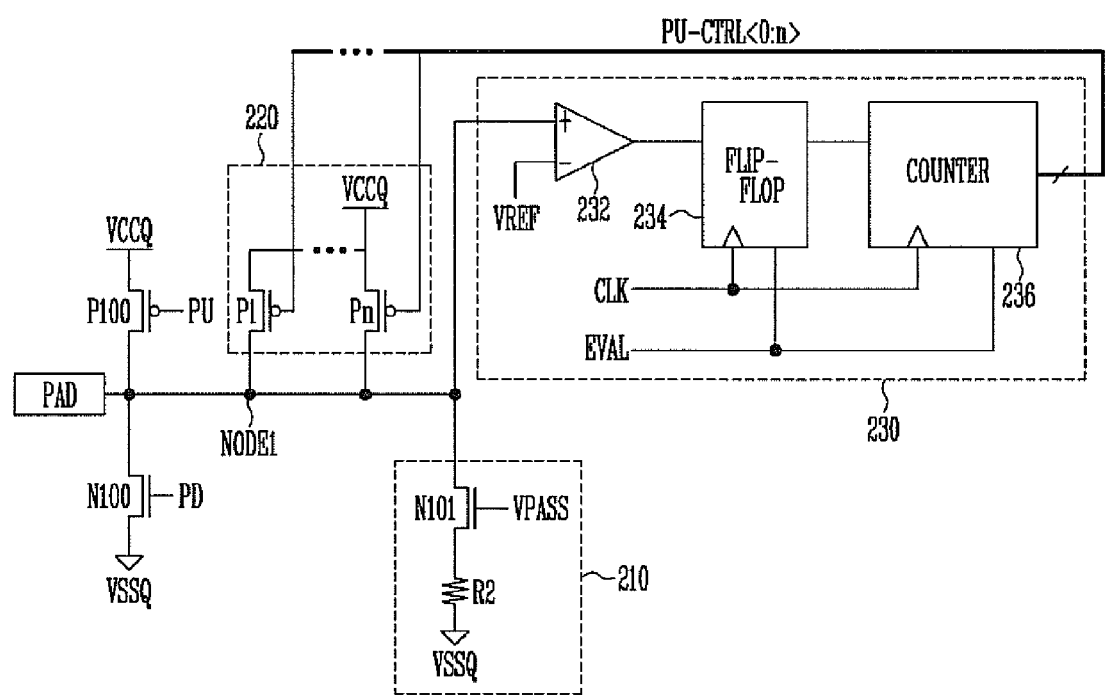
FIG. 2 is a circuit diagram of the pull-up impedance controller of the data output circuit according to an exemplary embodiment of this disclosure.

FIG. 2 is a circuit diagram of a pull-up impedance controller of the data output circuit according to an exemplary embodiment of this disclosure.

Referring to FIG. 2, the pull-up impedance controller senses a voltage of a node NODE1 and controls impedance of the node NODE1 for a pull-up driver P100 (hereinafter referred to as 'pull-up impedance').

The pull-up impedance controller includes a second resistor unit 210, a second variable resistor circuit 220, and a second impedance controller 230. The second resistor unit 210 is coupled between the node NODE1 and a ground terminal VSSQ and configured to have a constant resistance value. The second resistor unit 210 includes a resistor R2 and a switching element N101 coupled in series between the ground terminal VSSQ and the node NODE1. The switching element N101 is operated in response to a pass signal VPASS. According to an example, the pass signal VPASS has a voltage level equal to a sum of the power supply voltage VCCQ and 2Vt, where Vt is the threshold voltage of the switching element N101.

The second variable resistor circuit 220 varies a resistance value between the node NODE1 and a power supply terminal VCCQ in order to control the pull-up impedance in response to pull-up control signals PU-CTRL<0:n> generated by the second impedance controller 230.

More particularly, the second variable resistor circuit 220 includes a plurality of switching elements P1 to Pn coupled in parallel between the node NODE1 and the power supply terminal VCCQ. The switching elements P1 to Pn are selectively turned on in response to the respective pull-up control signals PU-CTRL<0:n>. A resistance value between the node NODE1 and the power supply terminal VCCQ through the second variable resistor circuit 220 is changed according to the number of turned-on switching elements. For example, with an increase in the number of turned-on switching elements, a resistance value between the node NODE1 and the power supply terminal VCCQ is lowered.

The second impedance controller 230 senses voltage of the node NODE1, outputs the pull-up control signals PU-CTRL<0:n> according to the sensed voltage, and changes data of the pull-up control signals PU-CTRL<0:n> according to the sensed voltage.

More particularly, the second impedance controller 230 includes a second comparator 232, a second flip-flop 234, and a second counter 236. The second comparator 232 compares a reference voltage VREF and a voltage of the node NODE1 and outputs a result of the comparison. The second flip-flop 234 transfers the output signal (that is, a result of the comparison) of the second comparator 232 in response to an enable signal EVAL and a clock signal CLK. The second counter 236 changes data of the pull-up control signals PU-CTRL<0:n> based on the output signal of the second flip-flop 134 in response to the enable signal EVAL and the clock signal CLK.

According to an example, a resistance value between the ground terminal VSSQ and the node NODE1 which is determined by the second resistor unit 210 is to be driven to be the same as a resistance value between the power supply terminal VCCQ and the node NODE1 which is determined by the second variable resistor circuit 220. To this end, the second impedance controller 230 compares voltage of the node NODE1 and the reference voltage VREF, where the reference voltage VREF is equal to a half of the power supply voltage of the power supply terminal VCCQ. If, as a result of the comparison, the voltage of the node NODE1 is higher than VCCQ/2, the second impedance controller 230 generates the pull-up control signals PU-CTRL<0:n> so that the number of switching elements P1 to Pn turned on in the second variable resistor circuit 220 is decreased. If, as a result of the comparison, the voltage of the node NODE1 is lower than VCCQ/2, the second impedance controller 230 generates the pull-up control signals PU-CTRL<0:n> so that the number of switching elements P1 to Pn turned off in the second variable resistor circuit 220 is increased.

Accordingly, the pull-up impedance controller in FIG. 2 controls impedance for the pull-up driver.

Meanwhile, the pre-driver controls the driving strength of the main driver.

Figure 3:
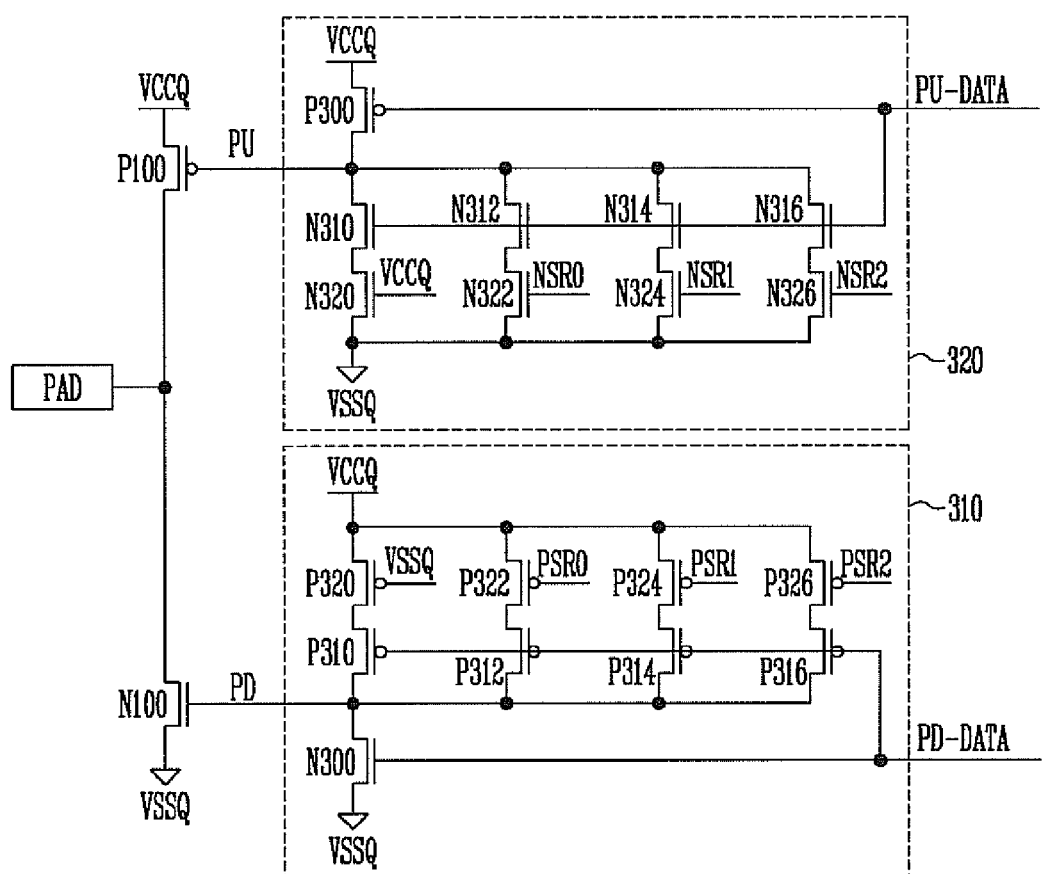
FIG. 3 is a circuit diagram of the pre-driver of the data output circuit according to an exemplary embodiment of this disclosure.
Figure 4:
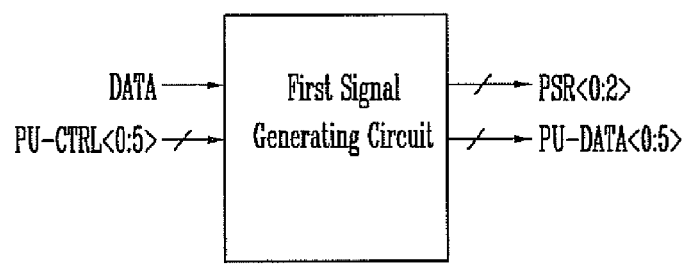
FIG. 4 is a circuit diagram of the first signal generating circuit of the data output circuit according to an exemplary embodiment of this disclosure.
Figure 5:
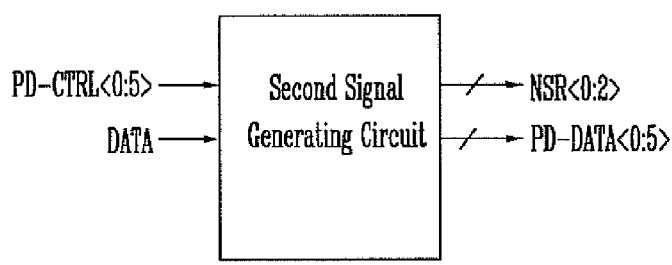
FIG. 5 is a circuit diagram of the second signal generating circuit of the data output circuit according to an exemplary embodiment of this disclosure.

FIG. 3 is a circuit diagram of the pre-driver of the data output circuit according to an exemplary embodiment of this disclosure. FIG. 4 is a circuit diagram of the first signal generating circuit of the data output circuit according to an exemplary embodiment of this disclosure. FIG. 5 is a circuit diagram of the second signal generating circuit of the data output circuit according to an exemplary embodiment of this disclosure.

Referring to FIG. 3, the pre-driver controls the driving strength of the pull-up driver P100 and the pull-down driver N100 in response to the pull-up control signals PU-CTRL<0:n> in FIG. 2 and the pull-down control signals PD-CTRL<0:n> in FIG. 1 and pull-up and pull-down enable signals PU-DATA and PD-DATA. The pre-driver includes a pull-down pre-driver 310 and a pull-up pre-driver 320. According to an example, the pre-driver may further include the first and second signal generating circuits as shown in FIGS. 4 and 5 for generating first and second driving control signals PSR0 to PSR2 and NSR0 to NSR2, respectively, using the pull-up control signals PU-CTRL<0:n> and the pull-down control signals PD-CTRL<0:n>.

The pull-down pre-driver 310 controls the driving strength of the pull-down driver N100 in response to the pull-down enable signal PD-DATA and the first driving control signals PSR0 to PSR2 generated using the pull-down control signals PD-CTRL<0:n>.

More particularly, the pull-down pre-driver 310 includes a first switching element N300, a first switching group (P310 to P316), and a second switching group (P320 to P326). The first switching element N300 is coupled between the ground terminal VSSQ and the input terminal of the pull-down driver N100 and operated according to a level of the pull-down enable signal PD-DATA. The first switching group includes switching elements P310 to P316 coupled in parallel to the input terminal of the pull-down driver N300 and operated according to a level of the pull-down enable signal PD-DATA. The second switching group includes switching elements P320 to P326 coupled between the power supply terminal VCCQ and the respective switching elements P310 to P316 and selectively operated according to the ground voltage of the ground terminal VSSQ and the first driving control signals PSR0 to PSR2, respectively. The first driving control signals PSR0 to PSR2 are generated by the first signal generating circuit in FIG. 4 in response to the pull-up control signals PU-CTRL<0:n>.

Referring to FIG. 4, when the pull-up control signals PU-CTRL<0:5> and data DATA are received, the first signal generating circuit generates the first driving control signals PSR0 to PSR2 and the pull-up enable signals PU-DATA<0:5> as shown in Table of FIG. 4. The pull-up enable signals PU-DATA<0:5> correspond to the pull-up control signals PU-CTRL<0:n>, respectively, and the use of the pull-up enable signals PU-DATA<0:5> is described below with reference to FIG. 6.

Referring back to FIG. 4, if the number of pull-up control signals PU-CTRL<0:n> having a high level is increased, the number of first driving control signals PSR0 to PSR2 having a high level is increased. If the driving strength of the switching elements corresponding to PMOS transistors is determined to have increased above a desired level, the number of first driving control signals PSR0 to PSR2 having a high level is increased. In this case, if the number of switching elements P322 to P326 to be turned off in the second switching group is increased, the level of a pull-down signal PD supplied to the gate of the pull-down driver N100 is controlled accordingly, and the driving strength of the pull-down driver N100 is controlled accordingly.

If the driving strength of the switching elements corresponding to PMOS transistors is decreased below a desired level, the number of first driving control signals PSR0 to PSR2 having a low level is increased. In this case, the number of switching elements P322 to P326 turned-on in the second switching group is increased.

The pull-up pre-driver 320 controls the driving strength of the pull-up driver P100 in response to the pull-up enable signal PU-DATA and the second driving control signals NSR0 to NSR2 generated using the pull-up control signals PU-CTRL<0:n>.

More particularly, the pull-up pre-driver 320 includes a second switching element P300, a third switching group (N310 to N316), and a fourth switching group (N320 to N326). The second switching element P300 is coupled between the power supply terminal VCCQ and the input terminal of the pull-up driver P100 and operated according to levels of the pull-up enable signals PU-DATA. The third switching group includes switching elements N310 to N316 coupled in parallel to the input terminal of the pull-up driver P100 and operated according to the levels of the pull-up enable signals PU-DATA. The fourth switching group includes switching elements N320 to N326 coupled between the ground terminal VSSQ and the respective switching elements N310 to N316 and selectively operated according to the power supply voltage of the power supply terminal VCCQ and the second driving control signals NSR0 to NSR2, respectively. The second driving control signals NSR0 to NSR2 are generated by the second signal generating circuit in FIG. 5 in response to the pull-down control signals PD-CTRL<0:n>.

Referring to FIG. 5, when the pull-down control signals PD-CTRL<0:5> and data DATA are received, the second signal generating circuit generates the second driving control signals NSR0 to NSR2 and the pull-down enable signals PD-DATA<0:5> as shown in Table of FIG. 5. The pull-down enable signals PD-DATA<0:5> correspond to the respective pull-down control signals PD-CTRL<0:n>, and the use of the signals is described below with reference to FIG. 6.

Referring to FIG. 5, if the number of pull-down control signals PD-CTRL<0:n> having a high level is increased, the number of second driving control signals NSR0 to NSR2 having a high level is increased. If the driving strength of the switching elements corresponding to NMOS transistors is decreased below a desired level, the number of second driving control signals NSR0 to NSR2 having a high level is increased. In this case, since the number of switching elements N322 to N326 turned-on in the fourth switching group is increased, the level of a pull-up signal PU supplied to the gate of the pull-up driver P100 is controlled accordingly, and the driving strength of the pull-up driver P100 is controlled accordingly.

However, if the driving strength of the switching elements corresponding to the NMOS transistors is increased above the desired level, the number of second driving control signals NSR0 to NSR2 having a low level is increased. In this case, the number of switching elements N322 to N326 turned-off in the fourth switching group is increased.

The first and the second signal generating circuits may be included in the pull-up pre-driver and the pull-down pre-driver, respectively.

Figure 6:
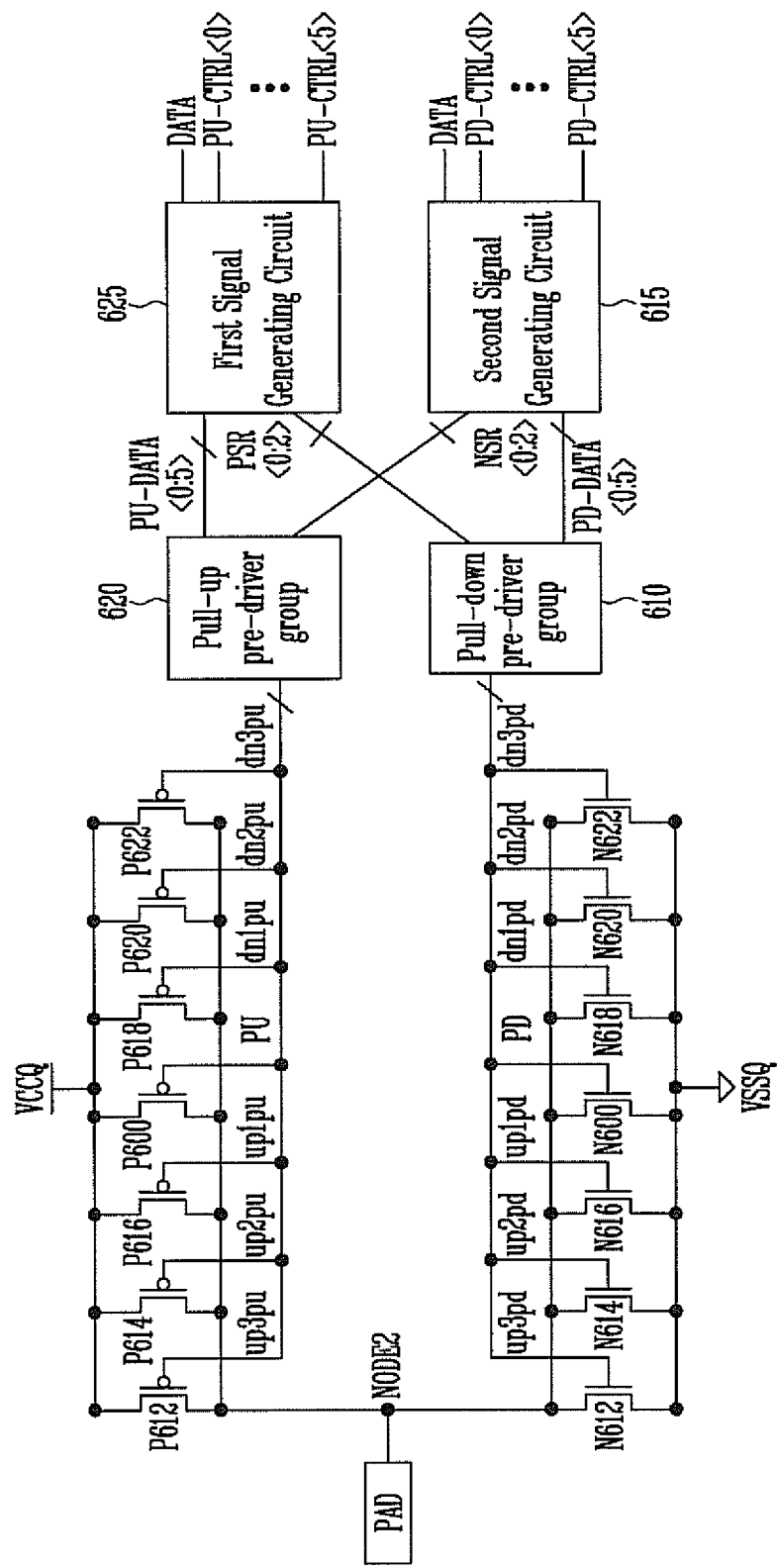
FIG. 6 is a circuit diagram of a data output circuit according to another exemplary embodiment of this disclosure.

FIG. 6 is a circuit diagram of a data output circuit according to another exemplary embodiment of this disclosure.

Referring to FIG. 6, the data output circuit includes a main driver, pull-down driving circuits N612 to N622, pull-up driving circuits P612 to P622, a pull-down pre-driver group 610, a first signal generating circuit 625, a pull-up pre-driver group 620, and a second signal generating circuit 615.

The main driver includes a pull-up driver P600 and a pull-down driver N600. The pull-up driver P600 is coupled between a power supply terminal VCCQ and a pad PAD or a node NODE2 coupled to the pad. The pull-down driver N600 is coupled between a ground terminal VSSQ and the pad PAD or the node NODE2 coupled to the pad.

The first signal generating circuit 625 generates pull-up enable signals PU-DATA<0:5> and first driving control signals PSR0 to PSR2 in response to data DATA and pull-up control signals PU-CTRL<0:5>. The pull-up enable signals PU-DATA<0:5> correspond to the pull-up control signals PU-CTRL<0:5>. The first signal generating circuit 625 has the same construction as the first signal generating circuit of FIG. 4, and a detailed description thereof is omitted as being redundant.

Here, the pull-up control signals PU-CTRL<0:n> may be generated by the pull-up impedance controller described with reference to FIG. 2.

The second signal generating circuit 615 generates the pull-down enable signals PD-DATA<0:5> and second driving control signals NSR0 to NSR2 in response to data DATA and pull-down control signals PD-CTRL<0:5>. The pull-down enable signals PD-DATA<0:5> correspond to the respective pull-down control signals PD-CTRL<0:5>. The second signal generating circuit 615 has the same construction as the second signal generating circuit of FIG. 5, and a detailed description thereof is omitted as being redundant.

The pull-down control signals PD-CTRL<0:n> may be generated by the pull-down impedance controller described with reference to FIG. 1.

The pull-down pre-driver group 610 includes a plurality of pull-down pre-drivers. Each of the pull-down pre-drivers has the same construction as the pull-down pre-driver described with reference to FIG. 3. It is assumed that 7 pull-down pre-drivers are included in the pull-down pre-driver group 610. One of the 7 pull-down pre-drivers is set by default and configured to generate a pull-down signal PD. The remaining 6 pull-down pre-drivers generate pull-down driving control signals up3pd, up2pd, up1pd, dn1pd, dn2pd, and dn3pd in response to the pull-down enable signals PD-DATA<0:5> of the second signal generating circuit 615 and the first driving control signals PSR0 to PSR2 of the first signal generating circuit 625. Accordingly, the pull-down pre-driver group 610 generates 7 pull-down related control signals, including the pull-down signal PD and the pull-down driving control signals up3pd, up2pd, up1pd, dn1pd, dn2pd, and dn3pd.

The pull-down driving circuits N612 to N622 are coupled in parallel to the pull-down driver N600 between the node NODE2 and the ground terminal VSSQ. The pull-down driving circuits N612 to N622 include the switching elements N612 to N622 selectively operated in response to the respective pull-down driving control signals up3pd, up2pd, up1pd, dn1pd, dn2pd, and dn3pd generated by the pull-down pre-driver group 610.

The pull-up pre-driver group 620 includes a plurality of pull-up pre-drivers. Each of the pull-up pre-drivers has the same construction as the pull-up pre-driver described with reference to FIG. 3. For purposes of illustration, it is hereinafter assumed that 7 pull-up pre-drivers are included in the pull-up pre-driver group 620. One of the seven pull-up pre-drivers is set by default and configured to generate a pull-up signal PU. The remaining pull-up pre-driver generate pull-up driving control signals up3pu, up2pu, up1pu, dn1pu, dn2pu, and dn3pu in response to the pull-up enable signals PU-DATA<0:5> of the first signal generating circuit 625 and the second driving control signals NSR0 to NSR2 of the second signal generating circuit 615. Accordingly, the pull-up pre-driver group 620 generates 7 pull-up related control signals, including the pull-down signal PU and the pull-up driving control signals up3pu, up2pu, up1pu, dn1pu, dn2pu, and dn3pu.

The pull-up driving circuits P612 to P622 are coupled in parallel to the pull-up driver P600 between the node NODE2 and the power supply terminal VCCQ. The pull-up driving circuits P612 to P622 include the switching elements P612 to P622 selectively operated in response to the respective pull-up driving control signals up3pu, up2pu, up1pu, dn1pu, dn2pu, and dn3pu generated by the pull-up pre-driver group 610.

The operation of the data output circuit constructed as above is described below.

The pull-up enable signals PU-DATA<0:5>, generated by the first signal generating circuit 625 and corresponding to the pull-up control signals PU-CTRL<0:n>, become enable signals for the respective pull-up pre-drivers included in the pull-up pre-driver group. Furthermore, the second driving control signals NSR<0:2> generated by the second signal generating circuit 615 are inputted to and shared by the pull-up pre-drivers. The pull-up pre-drivers activated in response of the pull-up enable signals PU-DATA<0:5>, from among the pull-up pre-drivers, activate the corresponding pull-up driving control signals up3pu, up2pu, up1pu, dn1pu, dn2pu, and dn3pu in response to the second driving control signals NSR<0:2>. Some of the switching elements P612 to P622 of the pull-up switching group are activated according to the activation states of the pull-up driving control signals up3pu, up2pu, up1pu, dn1pu, dn2pu, and dn3pu. Accordingly, the driving strength of the pull-up driving circuit performing the function of the pull-up driver is controlled.

Here, the pull-down enable signals PD-DATA<0:5>, generated by the second signal generating circuit 615 and corresponding to the respective pull-down control signals PD-CTRL<0:n>, become enable signals for the pull-down pre-drivers included in the pull-down pre-driver group. Furthermore, the first driving control signals PSR<0:2> generated by the first signal generating circuit 625 are inputted to and shared by the pull-down pre-drivers. The pull-down pre-driver activated in response to the pull-down enable signals PD-DATA<0:5>, from among the pull-down pre-drivers, activate the corresponding pull-down driving control signals up3pd, up2pd, up1pd, dn1pd, dn2pd, and dn3pd in response to the first driving control signals PSR<0:2>. Some of the switching elements N612 to N622 of the pull-down driving circuit are operated according to activation states of the pull-down driving control signals up3pd, up2pd, up1pd, dn1pd, dn2pd, and dn3pd. Accordingly, the driving strength of the pull-down driving circuit performing the function of the pull-down driver is controlled.

According to the present disclosure, a variable width of the slew rate of an output signal may be properly controlled by controlling the driving power of the pre-driver based on variable impedance of the main driver.

What is claimed is:

1. A data output circuit, comprising:
   a main driver including a pull-up driver coupled between a power supply terminal and a node coupled to a pad and a pull-down driver coupled between the node and a ground terminal;
   an impedance controller configured to control an output impedance of the node coupled to the pad by sensing a voltage at the node coupled to the pad and to generate pull-up control signals and pull-down control signals based on the sensed voltage; and
   a pre-driver configured to control driving strengths of the pull-up driver and the pull-down driver in response to the pull-up control signals generated by the impedance controller, the pull-down control signals generated by the impedance controller, a pull-up enable signal, and a pull-down enable signal,
   wherein the pull-up control signals and pull-down control signals vary a resistance between the pad and the ground terminal to control the output impedance of the node coupled to the pad.

2. The data output circuit of claim 1, wherein the impedance controller comprises:
   a pull-up impedance controller configured to control an impedance of the pull-up driver by sensing the voltage at the node and generate the pull-up control signals based on the sensed voltage; and
   a pull-down impedance controller configured to control an impedance of the pull-down driver by sensing the voltage at the node and generate the pull-down control signals based on the sensed voltage.

3. The data output circuit of claim 2, wherein the pull-down impedance controller comprises:
   a first resistor unit coupled between the pad and the power supply terminal;
   a first variable resistor circuit configured to control the impedance of the pull-down driver in response to the pull-down control signals by varying a resistance between the pad and the ground terminal; and
   a first impedance controller configured to sense the voltage at the node and vary the pull-down control signals based on the sensed voltage.

4. The data output circuit of claim 3, wherein the first variable resistor circuit comprises a plurality of switching elements coupled in parallel between the node and the ground terminal and configured to be selectively turned-on according to the pull-down control signals.

5. The data output circuit of claim 3, wherein the first impedance controller comprises:
   a first comparator for comparing a reference voltage and the voltage of the node;
   a first flip-flop for transferring an output signal of the first comparator in response to an enable signal and a clock signal; and
   a first counter for varying the data of the pull-down control signals based on an output signal of the first flip-flop in response to the enable signal and the clock signal.

6. The data output circuit of claim 2, wherein the pull-up impedance controller comprises:

a second resistor unit coupled between the pad and the ground terminal;
a second variable resistor circuit configured to control the impedance of the pull-up driver in response to the pull-up control signals by varying a resistance between the pad and the power supply terminal; and
a second impedance controller configured to sense the voltage of the node and vary the pull-up control signals based on the sensed voltage.

7. The data output circuit of claim 6, wherein the second variable resistor circuit comprises a plurality of switching elements coupled in parallel between the node and the power supply terminal and configured to be selectively turned-on according to the pull-up control signals.

8. The data output circuit of claim 6, wherein the second impedance controller comprises:
   a second comparator for comparing a reference voltage and the voltage of the node;
   a second flip-flop for transferring an output signal of the second comparator in response to an enable signal and a clock signal; and
   a second counter for varying the pull-up control signals based on the output signal of the second flip-flop in response to the enable signal and the clock signal.

9. The data output circuit of claim 1, wherein the pre-driver comprises:
   a signal generating circuit for generating pull-up driving control signals, pull-down driving control signals, a pull-up enable signal, and a pull-down enable signal in response to the pull-up control signals, the pull-down control signals, and the data;
   a pull-down pre-driver for controlling the driving strength of the pull-down driver in response to the pull-down driving control signals and the pull-down enable signals; and
   a pull-up pre-driver for controlling the driving strength of the pull-up driver in response to the pull-up driving control signals and the pull-up enable signal.

10. The data output circuit of claim 9, wherein the pull-down pre-driver comprises:
    a first switching element coupled between the ground terminal and an input terminal of the pull-down driver and switched on according to the pull-down enable signal;
    a first switching group including switching elements that are coupled in parallel to the input terminal of the pull-down driver and switched on according to the pull-down enable signal; and
    a second switching group including switching elements that are coupled between the power supply terminal and the switching elements of the first switching group, respectively, and selectively switched on in response to the pull-down driving control signals, respectively.

11. The data output circuit of claim 9, wherein the pull-up pre-driver comprises:
    a second switching element coupled between the power supply terminal and an input terminal of the pull-up driver and switched on according to the pull-up enable signal;
    a third switching group including switching elements that are coupled in parallel to the input terminal of the pull-up driver and switched on according to the pull-up enable signal; and
    a fourth switching group including switching elements that are coupled between the ground terminal and the switching elements of the first switching group, respectively, and selectively switched on according to the pull-up driving control signals, respectively.

12. A data output circuit, comprising:

a pull-up driving circuit coupled between a pad and a power supply terminal and configured to control a pull-up driving strength of the pull-up driving circuit in response to pull-up driving control signals;

a pull-down driving circuit coupled between the pad and a ground terminal and configured to control a pull-down driving strength of the pull-down driving circuit in response to pull-down driving control signals;

a first signal generating circuit configured to generate pull-up enable signals and first driving control signals in response to a data signal and pull-up control signals;

a second signal generating circuit configured to generate pull-down enable signals and second driving control signals in response to the data signal and pull-down control signals;

a pull-up pre-driver group configured to output the pull-up driving control signals in response to the pull-up enable signals and the second driving control signals; and a pull-down pre-driver group configured to output the pull-down driving control signals in response to the pull-down enable signals and the first driving control signals.

13. The data output circuit of claim 12, wherein: the pull-down pre-driver group comprises pull-down pre-drivers for generating the pull-down driving control signals, and each of the pull-down pre-drivers comprises:

a first switching element coupled between the ground terminal and an input terminal of a pull-down driver and switched on according to a level of one of the pull-down enable signals;

a first switching group configured to comprise switching elements that are coupled in parallel to the input terminal of the pull-down driver and are each switched on according to a respective one of the pull-down enable signals; and a second switching group configured to comprise switching elements that are coupled between the power supply terminal and the switching elements of the first switching group, respectively, and are selectively switched on according to the first driving control signals, respectively.

14. The data output circuit of claim 12, wherein: the pull-up pre-driver group comprises pull-up pre-drivers for generating the pull-up driving control signals, and each of the pull-up pre-driver comprises:

a second switching element coupled between the power supply terminal and an input terminal of a pull-up driver and switched on according to a respective one of the pull-up enable signals;

a third switching group including switching elements that are coupled in parallel to the input terminal of the pull-up driver and are each switched on according to a respective one of the pull-up enable signals; and a fourth switching group including switching elements that are coupled between the ground terminal and the respective switching elements of the first switching group and are selectively switched on according to the second driving control signals, respectively.

* * * * *